United States Patent [19]

Thomas et al.

[11] Patent Number: 4,619,719
[45] Date of Patent: Oct. 28, 1986

[54] PROCESS FOR FORMING A DOPED OXIDE FILM AND COMPOSITE ARTICLE

[75] Inventors: Ian M. Thomas, Temperance, Mich.; James J. Tillman, Toledo, Ohio

[73] Assignee: Owens-Illinois, Inc., Toledo, Ohio

[21] Appl. No.: 822,942

[22] Filed: Jan. 27, 1986

Related U.S. Application Data

[63] Continuation of Ser. No. 604,713, Apr. 27, 1984, abandoned, which is a continuation of Ser. No. 343,667, Jan. 28, 1982, abandoned.

[51] Int. Cl.$^4$ .......................................... H01L 21/385
[52] U.S. Cl. .................................... 148/188; 148/190; 427/85; 428/446
[58] Field of Search ............... 148/188, 190; 427/85; 428/446

[56] References Cited

U.S. PATENT DOCUMENTS

| 3,640,093 | 2/1972 | Levene et al. | 65/134 |
| 3,658,584 | 4/1972 | Schmidt | 148/188 X |
| 3,660,156 | 5/1972 | Schmidt | 148/188 X |
| 4,236,948 | 12/1980 | Seibold et al. | 148/188 |
| 4,251,285 | 2/1981 | Yoldas et al. | 148/188 X |

*Primary Examiner*—George T. Ozaki
*Attorney, Agent, or Firm*—John R. Nelson

[57] ABSTRACT

A process for forming a doped oxide film suitable for doping a semiconductor wafer substrate material and composite article. A silicon tetra-alkoxide is reacted with a limited amount of water to produce a low molecular weight, soluble polyorganosiloxane. The polyorganosiloxane is subsequently admixed with a reactive dopant source to form a soluble metallosiloxane polymer. The metallosiloxane polymer is coated onto a semiconductor wafer substrate material to produce a metallosiloxane-wafer composite article. The composite article is heated to produce an impurity doped semiconductor wafer suitable for electronic applications.

24 Claims, 1 Drawing Figure

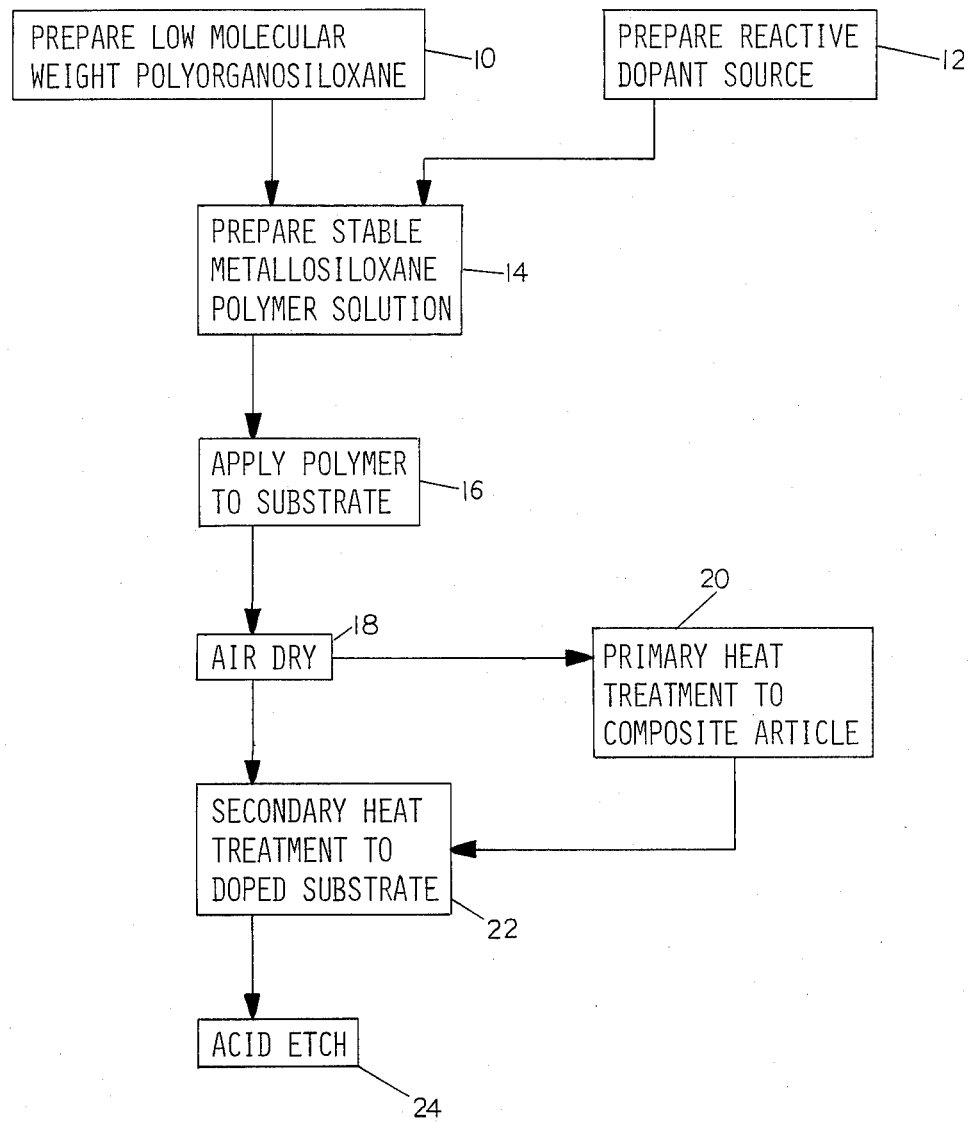

PROCESS FOR FORMING A DOPED OXIDE FILM AND COMPOSITE ARTICLE

This application is a continuation of application Ser. No. 604,713 filed Apr. 27, 1984, now abandoned, which is a continuation of application Ser. No. 343,667 filed Jan. 28, 1982, now abandoned.

TECHNICAL FIELD

This application is related to copending application Ser. No. 755,864 filed Feb. 11, 1982, both applications being assigned to the same assignee.

The present invention relates to the fabrication of semiconductor devices and more particularly to methods and compositions for the solid-state diffusion of conductive-type impurities from a dopant film into a semiconductor wafer or other substrate material.

BACKGROUND ART

The use of doped oxide films as source of impurities for solid-state diffusion in the fabrication of semiconductor devices is well established in the electronics art. Many attempts have been made in the past to provide uniform dopant ladened films which may be used to transfer N-type and P-type impurities into a semiconductor wafer material.

One approach has been to form a doped glassy layer on a semiconductor wafer by using silicone polymers which are admixed with dopant sources. The mixture of silicone polymer and dopant is coated onto a wafer and heated to produce a glassy dopant laden film. Upon further heating the dopant is diffused, in the solid state, from the glassy film into the semiconductor wafer. Such silicone based coating methods are exemplified in U.S. Pat. Nos. 3,084,079; 3,798,081 and 3,834,939. Such methods which rely on silicone polymer matrices suffer from several shortcomings. The silicon-carbon bond in the silicone polymer is not subject to hydrolytic degradation. Rather, such a bond must be thermally degraded in the presence of oxygen, at high temperatures. Circumstances exist where in high temperature degradation of the polymer matrix of the dopant are not advisable. Further, silicone polymers can cause significant carbonaceous residue deposition upon thermal degradation which is not precisely controlled. Such carbonaceous residue buildup adversely affects the uniformity of semiconductor doping upon use of such silicone polymers.

Another approach to semiconductor doping is represented by U.S. Pat. Nos. 3,615,943; 3,837,873; 3,915,766; 3,928,225; and 4,152,286. Each of these patents represents a method of semiconductor doping wherein a silicon tetra-alkoxide is converted via acetic anhydride (or lactic acid residue) to a mixed silicon acetate alkoxide. Such conversion eliminates the problem of premature volatilization of silicon material prior to conversion to the glass since silicon alkoxides are volatile while silicon acetates are less volatile. The mixed silicon acetate alkoxide is combined with a dopant source. Subsequently, the mixed alkoxide and dopant source are heated to degrade the mixed alkoxide silicate into a silica based glass with dopant contained therein. Such methods also suffer from the adversities well known when organic components (such as acetate and lactate residues) are thermally degraded a described above. Methods employing silicon acetate alkoxides material do exhibit the advantage of reduced volatility of the silicate upon initial heating to form a glassy matrix.

Other attempts to provide dopant sources for semiconductor wafer uses are disclosed in U.S. Pat. Nos. 3,789,023 and 4,243,427. U.S. Pat. No. 3,789,023 discloses a liquid diffusion dopant source for semrconductor doping involving dissolving dopants in an aqueous-alcoholic solution by refluxing the starting materials. Subsequently, to the refluxed material are added alcohols, an ethyl acetate and tetraethylorthosilicate.

U.S. Pat. No. 4,243,427 discloses a mixed solution approach to dopant source provision. The patent discloses a coating composition formed by heating mono-aluminum phosphate; adding methyl alcohol to the hot solution; cooling the solution and subsequently mixing tetraethylorthosilicate therewith. The solutions must be used rapidly once mixed due to the inherent instability of the resultant two component solutions.

The present invention provides a process and composition for semiconductor wafer doping which provides an extremely uniform dopant film or coating which is derived from very stable solutions of starting material. Further the present invention provides a liquid dopant source which is well suited to spin-coating applications and is maintained in the stable solution phase during all steps of the process, up to actual heating of the semiconductor wafer. No carbonaceous residues or nonuniformity of doping problems are experienced.

SUMMARY OF THE INVENTION

An object of the present invention is to provide an improved dopant coating method and composition for semiconductor wafer doping.

Another object of the invention is to provide for extremely uniform dopant source layers, or films, which are not adversely affected prior to deposition on the wafer by solution instability or post deposition by nonuniform dopant concentrations.

Still another advantage of the present invention is in the use of metallosiloxane-dopant source polymers as the glassy dopant source matrix for semiconductor wafer doping.

These and other objects of the present invention are realized by a process and composition for semiconductor doping which comprises combining a silicon tetraalkoxide with a less than stoichiometric amount of water, in the presence of an acid hydrolysis catalyst, to form a solution of a soluble low molecular weight siloxane polymer, or so-called oligomer. The low molecular weight siloxane polymer is subsequently reacted with a reactive dopant source to form a solution of a metallosiloxane-dopant polymer. The solution of metallosiloxane-dopant polymer is spincoated onto a semiconductor wafer substrate material to form a polymer coated wafer. The wafer is heated at relatively low temperatures to form a glassy matrix. Subsequently, the coated wafer may be heated at elevated temperatures to form a doped semiconductor wafer which is subsequently acid etched to remove the glassy residue.

BRIEF DESCRIPTION OF DRAWINGS

The details of the invention will be described in the accompanying specification in view of the drawing, in which:

FIG. 1 is a schematic representation of the process of the present invention.

DESCRIPTION OF THE INVENTION

In attaining the objects and advantages of the present invention, there is provided a process and composition of matter for forming a semiconductor doping film which comprises combining a silicon tetra-alkoxide with less than a stoichiometric amount of water, in the presence of an acid hydrolysis catalyst, to form a solution of a soluble low molecular weight polyorganosiloxane polymer or so-called oligomer. The low molecular weight polyorganosiloxane is reacted with a reactive dopant source to form a solution of a metallosiloxane-dopant polymer. The solution of metallosiloxane polymer is then coated or otherwise applied to a semiconductor wafer substrate material to form a metallosiloxane polymer coated wafer composite article. The coated wafer is subjected to a primary heat treatment wherein the wafer and metallosiloxane polymer coating are heated to about 300°–600° C. to form a glassy matrix on the semiconductor wafer. After the primary heat treatment step, the glass-wafer composite article may be stored until required or processed immediately to a secondary heat treatment step. In the secondary heat treatment step, the coated wafer is heated at an elevated temperature of about 1000°–1250° C. to effect semiconductor doping. Subsequently, the glass-wafer composite article is acid-etched to remove the glassy residue of the metallosiloxane polymer residue and yield a doped semiconductor suitable for electronic application.

As used herein, the phrase silicon tetra-alkoxide is defined as a compound of the formula $SiX_4$ wherein X is OR, wherein R is either an alkyl group of 1 to 6 carbon atoms or an alkoxy alkyl of the formula $R_1O(C_2H_4)$—wherein $R_1$ is an alkyl group of 1 to 6 carbon atoms.

As used herein, the phrase reactive dopant source is defined as a free acid, alkoxide or oxide of a Group III or Group V element which is soluble in anhydrous organic solvents, which is reactive with the SiOH or the SiOR moiety and which when so reacted to form a metallosiloxane polymer will thermally degrade to form a glass in the temperature range of about 300°–600° C.

As used herein the term metallosiloxane polymer is defined as a linear or partially cross-linked, high molecular weight polymer formed from the reaction of a partially hydrolyzed silicon tetra-alkoxide and a reactive dopant source to yield an organic solvent soluble, solution stable polymer.

The following series of reaction equations illustrate the reactions involved in the present process.

| Reactions of the Process |
|---|
| 1a. $Si(OEt)_4 + H_2O \longrightarrow (EtO)_3SiOH + EtOH$ |
| 1b. $(EtO)_3SiOH + HOSi(OEt)_3 \longrightarrow$ |
| $(EtO)_3Si-O-Si(OEt)_3 + H_2O$ |
| 1c. $(EtO)_3Si-O-Si(OEt)_3 + H_2O \longrightarrow$ |
| 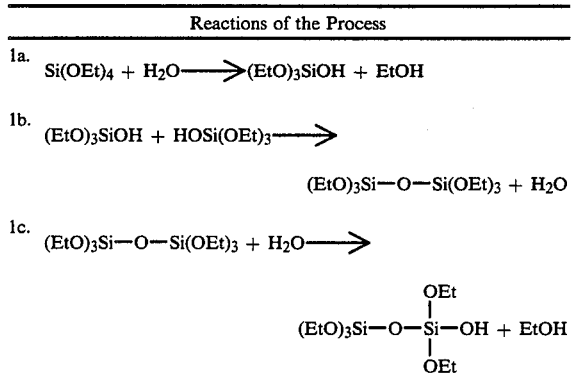 |

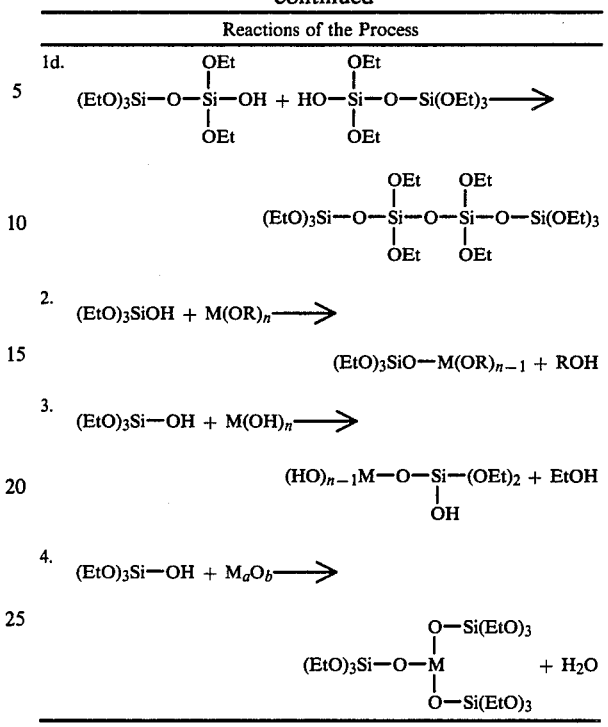

wherein:
Et is ethyl
M is a Group III or Group VB element
and $M_aO_b$ is an oxide of any M.

Reactions 1a.–1d. represent the formation, under the influence of an acid hydrolysis catalyst, of the polyorganosiloxane oligomer.

Reaction 2 represents the reaction of the triethoxy, monohydroxy silicon species, an intermediate in the polymer synthesis, with a dopant source alkoxide to form the metallosiloxane. Reaction 3 represents the analogous reaction with a dopant source free acid and Reaction 4 represents the analogous reaction with a dopant source oxide. Similar reactions to equations 2, 3 and 4 can occur with further polymerized siloxane species as exemplified by 1b, 1c and 1d.

In practicing the process of the present invention for forming dopant laden oxide films on semiconductor wafer materials a low molecular weight polyorganosiloxane polymer (or so-called oligomer) is prepared as illustrated at stage 10 of FIG. 1 and as represented in Reactions 1a.–1d. The polyorganosiloxane is prepared by reacting a silicon tetra-alkoxide with less than a stoichiometric amount of water, in the presence of an acid hydrolysis catalyst, in an anhydrous organic solvent.

In the preferred embodiment the silicon tetra-alkoxide is tetraethyl silicate monomer which is reacted with two moles of water per mole of tetraethyl silicate monomer. The reaction takes place in the presence of an anhydrous organic solvent, wherein the anhydrous organic solvent is defined as a low molecular weight liquid organic material which is substantially water free prior to forming the reaction mixture and forms a clear solution with the silicate monomer. Suitable organic solvents include low molecular weight alcohols, esters, ketones and ethers. Particularly preferred are ethanol and propanol.

As defined herein, acid hydrolysis catalyst means either a strong mineral acid or a Lewis acid. Suitable strong mineral acids include $HNO_3$, $H_2SO_4$, and $HCl$. Suitable Lewis acid catalysts include transitional element catalysts, such as, zirconium, titanium, or non-transitional elements such as aluminum. Generally, any catalytically effective amount of either the mineral acid or Lewis acid catalyst is acceptable.

Stage 12 of FIG. 1 illustrates the preparation of a reactive dopant source which will subsequently be reacted with the low molecular weight polyorganosiloxane. The reactive dopant source, as defined above, may be a free acid, alkoxide or oxide of a Group III or Group V element. Preferred dopant source materials include, for example, the free acids $H_3BO_3$, $H_3PO_4$, $H_3AsO_4$; the alkoxides $B(OR)_3$, $PO_2H(OR)_2$, $PO(OR)_3$, $PO(OR)(OH)_2$, $As(OR)_3$, $As(OR)_5$, $Sb(OR)_3$, $Sb(OR)_5$, and oxides of such elements, for example, $B_2O_3$. Other acceptable dopant source materials include $P(OR)_3$, $POH(OR)_2$ and $P(OH)_2(OR)$.

As indicated above the reactive dopant source should be soluble in the selected anhydrous organic solvent. Accordingly, free acids, alkoxides or oxides which are not soluble in the selected anhydrous organic solvent may be converted to soluble forms of the dopant. For example, arsenic trioxide, which is not soluble in anhydrous organic solvents, may be converted by conventional methods into arsenic acid which is soluble in anhydrous organic solvents, particularly alcohols. The conversion of insoluble Group III and Group V elements into soluble forms is well established in the art.

Stage 14 illustrates the admixture of the polyorganosiloxane prepared in Stage 10 with the reactive dopant source prepared in Stage 12, with the reactions for the alkoxide, free acid and oxide illustrated at Reactions 2, 3 and 4, respectively. The admixture of the materials from Stage 10 and 12 results in a metallosiloxane polymer formation. The metallosiloxane polymer incorporates the Group III or Group V element which is the active dopant material needed for semiconductor wafer doping. Typically, the metallosiloxane is in solution and subsequently admixing the dopant source with the low molecular weight siloxane.

In the alternative, where no advance preparation of a reactive dopant source is necessary, the reactive dopant source, for example, phosphoric acid may be added directly to the silicon tetra-alkoxide monomer in the presence of an anhydrous organic solvent, a less than stoichiometric amount of water and the selected catalyst. Such direct mixture of all materials results in an intermediate product, namely, a low molecular weight polyorganosiloxane which immediately reacts with the dopant source to produce the metallosiloxane polymer. In either alternative, both acid catalyzed polyorganosiloxane synthesis and the metallosiloxane synthesis occur at room temperature. Such room temperature reaction is a substantial advantage over high temperature material preparation of the prior art. For more rapid metallosiloxane preparation the reactions may occur at low temperatures to speed dissolution of reactants in the solvent.

Stage 16 illustrates the application of the metallosiloxane polymer to the semiconductor wafer material substrate. Preferably, appropriately sized, for example two inch diameter silicon wafers, are rotated at high RPMs, for example 2,500 RPMs, and sprayed with anhydrous isopropanol. The isopropanol wash removes surface contamination prior to deposition of the metallosiloxane polymer. Subsequently the metallosiloxane solution is placed on the wafer and rotated rapidly for a short time to establish a thin film of polymer in intimate, stable composite contact with the wafer substrate. It has been discovered by the present invention that the viscosity characteristics of the metallosiloxane polymers are advantageous to spin-coating of silicon wafers to form very uniform thin coatings. The metallosiloxane polymer-wafer composite article is stable under normal conditions and can be stored, shipped or processed further at once.

After the coating process illustrated in Stage 16 is completed, in the preferred embodiment, an air drying Stage 18 is performed. The air drying stage removes residual organic solvent residues and places the coated substrate in proper condition for immediate primary heat treating. Subsequent to the air drying Stage 18 a primary heat treating Stage 20 is performed wherein the coated wafer is heated to a temperature of 300°–600° C. Such low temperature heat treatment converts the metallosiloxane polymer into a uniform, thin film of glassy material in intimate composite contact with the underlying wafer. By practicing the present invention it is readily possible to produce uniform coatings of dopant laden glassy polymer on the wafer substrates on the order of 2,000–3,000 angstroms. While any suitable thickness may be chosen, it has been discovered that 2,000–3,000 angstroms is adequate to provide acceptable dopant levels in the final doped wafer product, as exemplified in the following Examples. The primary heat treating process of Stage 20 can be conducted in any suitable oxygen containing atmosphere. Air is suitable for this purpose. Also, the atmospheres described for the secondary heat treatment, discussed hereinafter, contain sufficient oxygen for the primary heat treatment.

Subsequently to the primary heat treatment Stage 20, the composite glass-substrate wafer article may be stored until further processing is required or directly moved to Stage 22.

Stage 22 illustrates the secondary heat treatment step wherein the glass-wafer composite article produced in Stage 20 is heat treated at about 950°–1300° C. to produce an impurity doped semiconductor wafer material. The preferred temperature range for the doping done in the secondary heat treatment Stage 22 is about 950°–1250° C. Such preferred temperature range achieves minimum thermal damage to the wafers and suitable doping. The Stage 22 secondary heat treatment is carried out in a conventional high temperature furnace of 3 inch internal sample tube diameter with a six inch long heating zone. The furnace has a constant flow gas system. For arsenic and antimony dopant sources an argon/oxygen gas system is preferred with 90% argon and 10% oxygen. However, gas mixtures of argon/oxygen from 80/20 to 95/5 may be used. When boron or phosphorus dopant sources are used, a nitrogen/oxygen atmosphere is preferred with a 90% nitrogen and 10% oxygen mixture.

The doped wafer material is next acid etched a Stage 24 to produce an impurity doped semiconductor suitable for electronic applications. Any acid etching material may be used, hydrofluoric acid is suitable.

By practicing the process of the present invention, a metallosiloxane polymer-wafer substrate composite article may be produced which may be further processed into a glass-wafer composite article or into a final impurity doped product suitable for semiconductor wafer applications. The process of the present invention produces uniformly dopant laden films or coatings which upon proper heating during the secondary heat treatment process produce uniformly impurity doped semiconducting devices. It has been discovered that the metallosiloxane polymers are particularly well suited to deposition of highly uniform dopant source layers to produce metallosiloxane wafer composite articles. Due to the fact that the alien dopant material is chemically restricted in the metallosiloxane polymer lattice the doping uniformity is highly improved over prior art processes wherein dopant uniformity has been difficult to establish.

Additionally, all steps in the process are carried out in a solution phase wherein each solution is extremely stable. However, it should be noted, that if high amounts of water are admixed with the silicon tetra-alkoxide or with the low molecular weight polyorganosiloxane prior to admixture with the dopant source, the material may gel or produce a solid precipitate on standing. Such gels are more difficult to coat as a uniform film and are not preferred. This may be conveniently avoided by restricting the access of atmospheric water to the solutions by the expedient of a simple drying tube attached to any container holding the solutions, prior to coating as at Stage 16. As coating occurs, atmospheric water aids in the gelling of the coated metallosiloxane. Such post-coating gelling does not adversely affect, in fact aids, the heat treatment phase of the present process.

The present invention produces a metallosiloxane polymer-wafer composite article or an impurity doped semiconductor wafer without the necessity of resorting to high temperature technology to produce the coated article, which can produce carbonaceous residues which adversely effect uniform dopant deposition and diffusion into the substrate wafer. Also, it has been discovered that the limited polymerization of the silicon tetra-alkoxide monomer to form the low molecular weight, solvent soluble polyorganosiloxane militates against the premature volatilization of the silicon tetra-alkoxide during the primary heat treatment Stage 20.

The following Examples are illustrative of the process of the present invention.

EXAMPLE 1

Part A

Preparation of Dopant Source

Four grams of arsenic trioxide ($As_2O_3$) is heated in 4 grams of concentrated nitric acid and 1 gram of concentrated hydrochloric acid in a flask fitted with a reflux condenser. The material is heated until a clear solution of arsenic acid is obtained, usually about 30 minutes. The solution is cooled and stored until use.

Part B

Direct Preparation of Metallosiloxane Polymer

To the cool solution of PART A is added 100 grams of anhydrous. isopropanol, 55.5 grams of tetraethylsilicate monomer and 6.1 grams of water. The resulting solution is refluxed for about one hour and cooled. The solution of the polyarsenosiloxane is mixed with sufficient anhydrous isopropanol to yield a total solution weight of 200 grams. This solution corresponds to a total oxide concentration of 10% including 20% arsenic oxide and 80% silica. Any solution ratio of arsenic oxide/silica from 50/50 to 10/90 can be prepared for use in PART C.

Part C

Coating and Doping Procedure

A two inch diameter silicon wafer, as purchased, is spun at 2,500 RPM and sprayed with anhydrous isopropanol to remove surface contaminants like dust. Next, about 0.5-0.7 grams of the metallosiloxane polymer solution of PART B is coated onto the wafer surface and wafer is spun at 2,500 RPM for about 15 seconds. The resulting wafer is coated with a thin, uniform polymer layer. The coated wafer is air dried for about 15 minutes to remove solvent.

After drying, the wafer is heated in a combined, primary-secondary heat treating step to between 1000°-1250° C. for at least 15 minutes. The wafers are heated in a conventional high temperature furnace of 3 inch internal sample tube diameter with a six inch long heating zone. The furnace has a constant flow gas system. The furnace is filled with a flowing stream of 90% argon-10% oxygen gas at a flow rate of one liter per minute argon and 0.1 liter per minute oxygen gas. After firing, the residuall film of glass is removed by acid etching with 5% HF (formed from 5 grams, 48% concentrated HF in 95 grams water) for about 20 minutes. The wafer is rinsed in water, dried and resistance tested to establish uniformity of doping, as indicated in TABLE I, below.

Part D

Results

For arsenic oxide/silica—20%/80% wafers produced in accordance with PARTS A-C above, the following uniform resistance measurements established very uniform doping when wafers are prepared according to the present process.

TABLE I

| Heat Treatment | | Resistance, OHMS/Square | | | No. of |
|---|---|---|---|---|---|
| Time | Temp. | High | Low | Avg. | Samples |
| 4 hrs | 1200° C. | 11.1 | 7.2 | 8.8 | 4 |
| 2 hrs | " | 11.7 | 9.3 | 10.5 | 4 |
| 1 hr | " | 13.6 | 11.4 | 12.8 | 4 |
| ½ hr | " | 23.4 | 17.0 | 19.1 | 4 |
| ¼ hr | " | 30.9 | 24.8 | 27.8 | 4 |
| 4 hrs | 1150° C. | 12.4 | 10.2 | 11.2 | 6 |
| 2 hrs | " | 18.7 | 16.2 | 17.5 | 4 |
| 1 hr | " | 22.7 | 20.2 | 21.2 | 4 |
| ½ hr | " | 34.7 | 26.1 | 29.0 | 4 |
| ¼ hr | " | 40.7 | 51.6 | 47.7 | 3 |
| 4 hrs | 1100° C. | 19.9 | 14.3 | 18.5 | 6 |
| 2 hrs | " | 25.0 | 24.0 | 24.5 | 3 |
| 1 hr | " | 33.9 | 29.8 | 32.2 | 3 |
| ½ hr | " | 61.1 | 49.9 | 54.4 | 3 |
| ¼ hr | " | 83.8 | 114.6 | 98.4 | 3 |

EXAMPLE 2

Part A

Direct Preparation of Siloxane Polymer

About 6.6 grams of phosphoric acid is added to 100 grams of isopropanol and four grams of water. Subsequently, 55.5 grams of tetraethyl silicate is added. The resulting solution is refluxed for about one hour and cooled. The solution of polyphosphorosiloxane is mixed with sufficient anhydrous isopropanol to yield a total solution weight of about 200 grams. This solution corresponds to a total oxide concentration of 10% including 20% $P_2O_5$ and 80% $SiO_2$. As in Example 1, the $P_2O_5$/$SiO_2$ solution ratios may be varied from 50/50 to 10/90 to produce a solution for use.

Part B

Coating and Doping Procedure

A two inch square silicon wafer, as purchased, is spun at 2,500 RPM and sprayed with anhydrous isopropanol to remove surface contaminants like dust. Next, about 0.5–0.7 grams of the metallosiloxane polymer solution of PART A is coated onto the wafer surface. The wafer is spun at 2,500 RPM for about 15 seconds. The resulting wafer is coated with a thin, uniform polymer layer. The coated wafer is air dried for about 15 minutes to remove solvent.

After drying, the wafer is heated in a combined primary-secondary heat treating step to between 1000°–1200° C. for at least 15 minutes. The heat treating process is carried out in an oven with a flowing carrier gas mixture to minimize silicon wafer degradation. After firing the residual film of polymer is removed by acid etching with 5% HF (formed from 5 grams, 48% concentrated HF in 95 grams water) for about 20 minutes. The wafer is rinsed in water, dried and resistance tested to establish uniformity of doping.

Part C

Results

For phosphoric oxide/silica—20%/80% wafers produced in accordance with PARTS A-B above, the following uniform resistance measurements established very uniform doping when wafers are prepared according to the present process.

TABLE II

| Heat Treatment | | Carrier Gas (liter/minute) | | | Resistance (OHMS/Square) | | | No. of |
|---|---|---|---|---|---|---|---|---|
| Time | Temp. | $N_2$ | $O_2$ | $Ar_2$ | High | Low | Avg. | Samples |
| 4 hrs | 1100° C. | 1 | .1 | — | 7.2 | 6.8 | 6.9 | 6 |
| 4 hrs | 1150° C. | 1 | .1 | — | 5.1 | 4.6 | 4.9 | 6 |
| 4 hrs | 1050° C. | 1 | .1 | — | 21.2 | 18.4 | 19.4 | 6 |
| 4 hrs | 1100° C. | — | .1 | 1 | 8.8 | 7.8 | 8.3 | 12 |
| 2 hrs | 1150° C. | 1 | .1 | — | 5.3 | 5.0 | 5.2 | 3 |

EXAMPLE 3

Part A

Direct Preparation of Siloxane Polymer

Eight grams of arsenic oxide ($As_2O_3$) is added to 8.0 grams concentrated $HNO_3$, 1 gram of concentrated HCl and 4 grams water. The mixture is refluxed until the solution is clear. The solution is cooled to about room temperature. Subsequently, 111.0 grams of tetraethylsilicate is added along with 150 grams isopropanol and 8.2 grams of water. The resulting solution is refluxed for about 1.5 hours and cooled to about room temperature. The solution of polyarsenosiloxane is mixed with sufficient anhydrous isopropanol to yield a total solution weight of about 400 grams. This solution corresponds to a total oxide concentration of 10% including 20% arsenic oxide and 80% silica.

Part B

Coating and Doping Procedure

A two inch diameter silicon wafer, as purchased, is spun at 2,500 RPM and sprayed with anhydrous isopropanol to remove surface contaminants like dust. Next, about 0.5–0.7 grams of the metallosiloxane polymer solution of PART A is coated onto the wafer surface. The wafer is spun at 2,500 RPM for about 15 seconds. The resulting wafer is coated with a thin, uniform polymer layer. The coated wafer is air dried for about 15 minutes to remove solvent.

After drying, the wafer is heated in a combined primary-secondary heat treating step to between 1000°–1200° C. for at least 15 minutes. The wafers are heated in a conventional high temperature furnace of 3 inch internal sample tube diameter with a six inch long heating zone. The furnace has a constant flow gas system. The furnace is filled with a flowing stream of 90% argon-10% oxygen gas at a flow rate of one liter per minute argon and 0.1 liter per minute oxygen gas. After firing the residual film of polymer is removed by acid etching with 5% HF (formed from 5 grams, 48% concentrated HF in 95 grams water) for about 20 minutes. The wafer is rinsed in water, dried and resistance tested to establish uniformity of doping.

Part C

Results

For arsenic oxide/silica—20%/80% wafers produced in accordance with PARTS A-B above, the following uniform resistance measurements established very uniform doping when wafers are prepared according to the present process.

TABLE III

| Heat Treatment | | Resistance, OHMS/Square | | | No.of |
|---|---|---|---|---|---|
| Time | Temp. | High | Low | Average | Samples |
| 4 hrs | 1200° C. | 8.2 | 7.3 | 7.6 | 6 |
| 2 hrs | " | 9.2 | 8.3 | 8.8 | 6 |
| 1 hr | " | 16.7 | 11.7 | 13.5 | 6 |
| ½ hr | " | 17.6 | 15.6 | 16.4 | 5 |
| ¼ hr | " | 32.8 | 27.7 | 29.7 | 5 |
| 4 hrs | 1150° C. | 9.6 | 7.5 | 8.7 | 6 |
| 2 hrs | " | 14.4 | 12.1 | 13.2 | 5 |
| 1 hr | " | 20.7 | 17.0 | 18.2 | 5 |
| ½ hr | " | 53.3 | 34.4 | 42.5 | 6 |
| ¼ hr | " | 76.4 | 54.9 | 63.5 | 5 |
| 4 hrs | 1100° C. | 15.3 | 14.3 | 14.7 | 3 |
| 2 hrs | " | 19.8 | 18.9 | 19.5 | 3 |
| 1 hr | " | 42.3 | 33.3 | 37.6 | 3 |
| ½ hr | " | 53.2 | 49.6 | 51.3 | 3 |
| ¼ hr | " | 66.6 | 54.7 | 59.9 | 3 |

EXAMPLE 4

Part A

Direct Preparation of Siloxane Polymer

Four and three-tenths grams of water, 0.5 grams of 1 N nitric acid and 27.8 grams of tetraethylsilicate are mixed with 30 grams of anhydrous isopropanol. The resulting solution is refluxed for 5 minutes. Then, 4.4 grams of diethylphosphate is added and the solution refluxed for an additional 5 minutes. The solution of polyphosphorosiloxane is mixed with sufficient anhydrous isopropanol to yield a total solution weight of about 100 grams. This solution corresponds to a total oxide concentration of 10% including 20% phosphoric oxide and 80% silica.

Part B

Coating and Doping Procedure

A two inch diameter silicon wafer, as purchased, is spun at 2,500 RPM and sprayed with anhydrous isopropanol to remove surface contaminants like dust. Next, about 0.5–0.7 grams of the polyphosphorosiloxane polymer solution of PART A is coated onto the wafer surface. The wafer is spun at 2,500 RPM for about 15 seconds. The resulting wafer is coated with a thin, uniform polymer layer. The coated wafer is air dried for about 15 minutes to remove solvent.

After drying, the wafer is heated in a combined primary-secondary heat treating step to between 1000°–1200° C. for at least 15 minutes. The wafers are heated in a conventional high temperature furnace of 3 inch internal sample tube diameter with a six inch long heating zone. The furnace has a constant flow gas system. The furnace is filled with a flowing stream of 90% argon-10% oxygen gas at a flow rate of 1 liter per minute argon and 0.1 liter per minute oxygen gas. After firing the residual film of polymer is removed by acid etching with 5% HF (formed from 5 grams, 48% concentrated HF in 95 grams water) for about 20 minutes. The wafer is rinsed in water, dried and resistance tested to establish uniformity of doping.

Part C

Results

For phosphoric oxide/silica—20%/80% wafers produced in accordance with PARTS A-B above, the following uniform resistance measurements established very uniform doping when wafers are prepared according to the present process.

TABLE IV

| Heat Treatment | | Resistance, OHMS/Square | | | No.of |
|---|---|---|---|---|---|
| Time | Temp. | High | Low | Average | Samples |
| 2 hrs | 1100° C. | 6.1 | 4.9 | 5.5 | 12 |

EXAMPLE 5

Part A

Direct Preparation of Siloxane Polymer

Four and three-tenths grams of water, 0.5 grams of 1 N nitric acid and 27.8 grams of tetraethylsilicate are mixed with 30 grams of anhydrous isopropanol. The resulting solution is refluxed for 5 minutes. Then, 5.1 grams of dibutylphosphate is added and the solution refluxed for an additional 5 minutes. The solution of polyphosphorosiloxane is mixed with sufficient anhydrous isopropanol to yield a total solution weight of about 100 grams. This solution corresponds to a total oxide concentration of 10% including 20% phosphoric oxide and 80% silica.

Part B

Coating and Doping Procedure

A two inch diameter silicon wafer, as purchased, is spun at 2,500 RPM and sprayed with anhydrous isopropanol to remove surface contaminants like dust. Next, about 0.5–0.7 grams of the polyphosphorosiloxane polymer solution of PART A is coated onto the wafer surface. The wafer is spun at 2,500 RPM for about 15 seconds. The resulting wafer is coated with a thin, uniform polymer layer. The coated wafer is air dried for about 15 minutes to remove solvent.

After drying, the wafer is heated in a combined primary-secondary heat treating step to between 1000°–1200° C. for at least 15 minutes. The wafers are heated in a conventional high temperature furnace of 3 inch internal sample tube diameter with a six inch long heating zone. The furnace has a constant flow gas system. The furnace is filled with a flowing stream of 90% argon-10% oxygen gas at a flow rate of one liter per minute argon and 0.1 liter per minute oxygen gas. After firing the residual film of polymer is removed by acid etching with 5% HF (formed from 5 grams, 48% concentrated HF in 95 grams water) for about 20 minutes. The wafer is rinsed in water, dried and resistance tested to establish uniformity of doping.

Part C

Results

For phosphoric oxide/silica—20%/80% wafers produced in accordance with PARTS A-B above, the following uniform resistance measurements established very uniform doping when wafers are prepared according to the present process.

TABLE V

| Heat Treatment | | Resistance, OHMS/Square | | | No.of |
|---|---|---|---|---|---|
| Time | Temp. | High | Low | Average | Samples |
| 4 hrs | 1000° C. | 16.1 | 11.7 | 13.1 | 6 |
| 2 hrs | 1100° C. | 5.5 | 4.9 | 5.1 | 12 |

EXAMPLE 6

Part A

Direct Preparation of Siloxane Polymer

Eight and six-tenths grams of water and 1.0 gram of 1 N nitric acid are added to 55.5 grams of tetraethylsilicate and 60 grams of anhydrous isopropanol. The solution is refluxed for 30 minutes and cooled to room temperature. Next, 27.1 grams of trimethyoxyethylborate is added and the mixture refluxed for two hours. The solution of polyborosiloxane is mixed with 15 grams of 2-ethyl hexanol and sufficient anhydrous isopropanol to result in a total solution of about 200 grams. This solution corresponds to a total oxide concentration of 10% including 20% boric oxide and 80% silica.

Part B

Coating and Doping Procedure

A two inch diameter silicon wafer, as purchased, is spun at 2,500 RPM and sprayed with anhydrous isopropanol to remove surface contaminants like dust. Next, about 0.5–0.7 grams of the metallosiloxane polymer solution of PART A is coated onto the wafer surface. The wafer is spun at 2,500 RPM for about 15 seconds. The resulting wafer is coated with a thin, uniform polymer layer. The coated wafer is air dried for about 15 minutes to remove solvent. After drying the wafer is heated in a combined primary-secondary heat treating step to between 1000°–1200° C. for at least 15 minutes. The wafers are heated in a conventional high temperature furnace of 3 inch internal sample tube diameter with a six inch long heating zone. The furnace is filled with a flowing stream of 90% argon-10% oxygen gas at a flow rate of one liter per minute argon and 0.1 liter per minute oxygen gas. After firing the residual film of polymer is removed by acid etching with 5% HF (formed from 5 grams, 48% concentrated HF in 95 grams water) for about 20 minutes. The wafer is rinsed in water, dried and resistance tested to establish uniformity of doping.

Part C
Results

For the 20% boric oxide/80% silica—20%/80% wafers produced in accordance with PARTS A-B above, the following uniform resistance measurements established very uniform doping when wafers are prepared according to the present process.

TABLE VI

| Heat Treatment | | Resistance, OHMS/Square | | | No. of |
| --- | --- | --- | --- | --- | --- |
| Time | Temp. | High | Low | Average | Samples |
| 2 hrs | 1100° C. | 13.6 | 10.0 | 11.4 | 8 |

We claim:

1. A process for doping a semiconductor substrate material comprising:
   a. combining a silicon tetra-alkoxide of the formula $SiX_4$ wherein X is OR, wherein R is an alkyl group of one to six carbon atoms, with less than a stoichiometric amount of water, in the presence of an acid hydrolysis catalyst, to prepare a solution of a low molecular weight polyorganosiloxane;
   b. reacting said polyorganosiloxane with a soluble reactive dopant source compound in which the dopant element is selected from a member of the group consisting of P, Sb and As to form a solution of an organo siloxane polymer;
   c. coating said organo siloxane polymer onto said substrate material;
   d. converting the coating formed in step C to a glassy layer on said substrate material; and
   e. heating said glassy layer coated substrate material for a time sufficient and at a temperature sufficient to diffuse said dopant element from the glassy layer into said substrate material.

2. The invention defined in claim 1 wherein said silicon tetra-alkoxide is tetraethylsilicate and the molar ratio of water to silicon alkoxide in the hydrolysis step of step a is about 1/1 to 2/1.

3. The invention of claim 1 wherein said catalyst is a strong mineral acid.

4. The invention of claim 1 wherein said reactive dopant source compound is a free acid, alkoxide or oxide of the dopant element.

5. The invention defined in claim 1 wherein said glass layer is formed by coating said siloxane polymer onto said substrate in step c and heat treating at about 300°–600° C. in step d.

6. The invention defined in claim 1 wherein said doping temperature is about 1000°–1250° C. in step e and said doping time is about 0.25–4 hours in step e.

7. The invention defined in claim 1 wherein said silicon tetra-alkoxide is tetraethylsilicate, the dopant element is Sb, and the molar ratio of water to silicon alkoxide in the hydrolysis step of step a is about 1/1 to 2/1.

8. A process for doping a semiconductor substrate material comprising:
   a. combining a silicon tetra-alkoxide of the formula $SiX_4$ wherein X is OR, wherein R is either an alkyl group of one to six carbon atoms or an alkoxy alkyl group of the formula $R_1O(C_2H_4)$—wherein $R_1$ is an alkyl group of 1 to 6 carbon atoms, with less than a stoichiometric amount of water in which the molar ratio of water to silicon alkoxide is about 1/1 to 2/1, in the presence of an acid hydrolysis catalyst, to prepare a solution of a low molecular weight polyorganosiloxane;
   b. reacting said polyorganosiloxane with a reactive dopant source to form a solution of a polymetallosiloxane polymer that is a reaction product;
   c. coating the polymer reaction product resulting from step b onto said substrate material;
   d. converting the coating of step c on said substrate material to a glassy layer on said substrate material;
   e. heating said glass coated substrate material for a time sufficient and at temperature sufficient to diffuse said dopant into said substrate material; and
   f. removing said glass coating from said substrate material.

9. The invention defined in claim 8 wherein said silicon tetra-alkoxide is tetraethylsilicate.

10. The invention of claim 8 wherein said catalyst is a strong mineral acid.

11. The invention of claim 8 whrein said reactive dopant source is a free acid, alkoxide or oxide of a Group VB element.

12. The invention defined in claim 8 wherein said glass layer is formed by coating said polymer reaction produced onto said substate and heat treating at about 300°–600° C. in step d.

13. The invention defined in claim 8 wherein said doping temperature is about 1000°–1250° C. and said doping time is aobut 0.25–4 hours in step e.

14. The invention defined in claim 8 wherein said glass coating is removed by acid etching with concentrated hydrofluoric acid.

15. A process for producing a polymetalloxiloxane-semiconductor substrate material composite article comprising:
   a. combining a silicon tetra-alkoxide of the formula $SiX_4$ wherein X is OR, where R is either an alkyl group of one to six carbon atoms or an alkoxy alkyl group of the formula $R_1O(C_2H_4)$—wherein $R_1$ is an alkyl group of 1 to 6 carbon atoms, with less than a stoichiometric amount of water in which the molar ratio of water to silicon alkoxide is about 1/1 to 2/1, in the presence of an acid hydrolysis catalyst, to prepare a solution of a low molecular weight polyorganosiloxiane;
   b. reacting said polyorganosiloxane with a reactive dopant source compound comprising a Group VB element of the periodic table having an atomic weight from about 30.975 to about 121.76 to form a solution of a polymetallosiloxane polymer; and
   c. forming a thin layer of said polymetallosiloxane on said substrate material.

16. The invention defined in claim 15 wherein said silicon tetra-alkoxide is tetraethylsilicate.

17. The invention of claim 15 wherein said catalyst is a strong mineral acid.

18. A process for doping a semiconductor substrate material comprising:
   a. combining a silicon tetra-alkoxide of the formula $SiX_4$ wherein X is OR, wherein R is either an alkyl group of one to six carbon atoms or an alkoxy alkyl group of the formula $R_1O(C_2H_4)$—wherein $R_1$ is an alkyl group of 1 to 6 carbon atoms, with less than a stoichiometric amount of water in which the molar ratio of water to silicon alkoxide is about 1/1 to 2/1 and a reactive dopant source compound comprising a Group VB element of the periodic table having an atomic weight from about 30.975 to about 121.76, in the presence of an acid hydrolysis catalyst, to prepare a solution of a polymetallosiloxane reaction product;

b. forming a thin layer of said polymetallosiloxane reaction product on said substrate material; and c. heating said polymetallosiloxane reaction product layer coated substrate for a time sufficient and at a temperature sufficient to diffuse said dopant into said substrate material.

19. The invention defined in claim 18 wherein said silicon tetra-alkoxide is tetraethylsilicate.

20. The invention of claim 18 wherein said catalyst is a strong mineral acid.

21. The invention defined in claim 18 wherein said doping temperature is about 1000°–1250° C. and said doping time is about 0.25–4 hours.

22. A process for doping a semiconductor substrate material comprising:

a. combining a silicon tetra-alkoxide of the formula SiX$_4$ wherein X is OR, wherein R is an alkyl group of one to six carbon atoms with less than a stoichiometric amount of water, in the presence of an acid hydrolysis catalyst that is a strong mineral acid, to prepare a solution of a low molecular weight polyorganosiloxane;

b. reacting said polyorganosiloxane with a soluble reactive dopant source compound containing P as a dopant element to form a solution of a siloxane polymer;

c. coating said siloxane polymer onto said substrate material;

d. converting the coating formed in step c to a glassy layer on said substrate material; and e. heating said glassy layer coated substrate material for a time sufficient and at a temperature sufficient to diffuse said dopant from the glassy layer into said substrate material.

23. A process for doping a semiconductor substrate material comprising:

a. combining a silicon tetra-alkoxide of the formula SiX$_4$ wherein X is OR, wherein R is an alkyl group of one to six carbon atoms, with less than a stoichiometric amount of water in which the molar ratio of water to silicon alkoxide is about 1/1 to 2/1 and a reactive dopant source compound containing a dopant element selected from a member of the group consisting of As, Sb, and P, in the presence of an acid hydrolysis catalyst, to prepare a solution of an organosiloxane polymer reaction product;

b. forming a thin layer of said reaction product on said substrate material; and c. heating said reaction product layer coated substrate for a time sufficient and at a temperature sufficient to diffuse said dopant into said substrate material.

24. A process for producing a polymetallosiloxane-semiconductor substrate material composite article comprising:

a. combining a silicon tetra-alkoxide of the formula SiX$_4$ wherein X is OR, where R is an alkyl group of one to six carbon atoms, with less than a stoichiometric amount of water in which the molar ratio of water to silicon alkoxide is about 1/1 to 2/1, in the presence of an acid hydrolysis catalyst, to prepare a solution of a low molecular weight polyorganosiloxane;

b. reacting said polyorganosiloxane with a reactive dopant source compound in which the doping element is selected from a member of the group consisting of P, As and Sb to form a solution of an organosiloxane polymer; and c. forming a thin layer of said organosiloxane polymer on said substrate material.

* * * * *